United States Patent
Huang et al.

(10) Patent No.: US 10,929,102 B2
(45) Date of Patent: Feb. 23, 2021

(54) TRUE RANDOM NUMBER GENERATOR

(71) Applicant: TONGXIN MICROELECTRONICS CO., LTD., Beijing (CN)

(72) Inventors: Jinhuang Huang, Beijing (CN); Qiulin Xu, Beijing (CN); Linlin Su, Beijing (CN); Yuchen Wang, Beijing (CN); Chao Yue, Beijing (CN)

(73) Assignee: TONGXIN MICROELECTRONICS CO., LTD., Beijing (CN)

( * ) Notice: Subject to any disclaimer, the term of this patent is extended or adjusted under 35 U.S.C. 154(b) by 10 days.

(21) Appl. No.: 16/233,827

(22) Filed: Dec. 27, 2018

(65) Prior Publication Data

US 2020/0174752 A1    Jun. 4, 2020

(30) Foreign Application Priority Data

Nov. 30, 2018    (CN) .......................... 201811452815.8

(51) Int. Cl.
*G06F 7/58*    (2006.01)

(52) U.S. Cl.
CPC .................................. *G06F 7/588* (2013.01)

(58) Field of Classification Search
CPC ........................................................ G06F 7/588
See application file for complete search history.

(56) References Cited

U.S. PATENT DOCUMENTS

| | | | |
|---|---|---|---|
| 5,963,104 A | 10/1999 | Buer | |
| 2006/0173943 A1* | 8/2006 | Luzzi | G06F 7/588 708/250 |
| 2010/0281088 A1* | 11/2010 | Wilber | G06F 7/588 708/251 |
| 2014/0237011 A1* | 8/2014 | Sackett | G06F 7/582 708/250 |
| 2014/0280413 A1* | 9/2014 | Lewis | G06F 7/588 708/251 |

FOREIGN PATENT DOCUMENTS

EP    2933719 A1    10/2015

OTHER PUBLICATIONS

European Patent Office, Extended European Search Report for EP Application No. 18215663.8, dated Jul. 18, 2019.
Mei Faqiang et al, "A Highly Flexible Lightweight and High Speed True Random Number Generator on FPGA", 2018 IEEE Computer Society Annual Symposium on VLSI (ISVLSI), IEEE, Jul. 8, 2018, pp. 399-404, XP033382422, DOI: 10.1109/ISVLSI.2018.00079 [retrieved on Aug. 7, 2018].

\* cited by examiner

*Primary Examiner* — Chuong D Ngo
(74) *Attorney, Agent, or Firm* — Honigman LLP; Brandon C. Griffith; Jonathan P. O'Brien

(57) ABSTRACT

A true random number generator is provided. The true random number generator includes an Exclusive-Or (XOR) circuit and multiple random entropy source circuits. One entropy source sampling process is performed at an output terminal of each of at least two inverters in each of the multiple random entropy source circuits, which is performed by a flip-flop corresponding to the inverter. Sampling results are inputted to an XOR unit in the random entropy source circuit and XOR processing is performed on the sampling results. XOR processing results outputted by the multiple of random entropy source circuits are inputted to the XOR circuit, and the XOR processing is performed on the XOR processing results to obtain a random number sequence.

5 Claims, 3 Drawing Sheets

TRUE RANDOM NUMBER GENERATOR

CROSS REFERENCE OF RELATED APPLICATION

This application claims the priority to Chinese Patent Application No. 201811452815.8, titled "TRUE RANDOM NUMBER GENERATOR", filed on Nov. 30, 2018 with the Chinese Patent Office, which is incorporated herein by reference in its entirety.

FIELD

The present disclosure relates to the technical field of integrated circuits, and in particular to a true random number generator (TRNG).

BACKGROUND

A random number generator is an important part in an information security system, and is widely used in fields such as key generation, identity authentication to provide a trusted root for the information security system. The random number generator is a special integrated circuit chip in which unexpected random numbers are generated by acquiring random quantities in natural environments or a random number generation component in the chip. In general, the natural random quantities acquired by the random number generator are thermal noise. The thermal noise may be provided by an amplifier method, an oscillator sampling method or a chaos method, and true random numbers required by the system are generated according to the thermal noise.

Among the common methods of providing the thermal noise, the amplifier method is easily affected by the environment in principle and is not widely used. In addition, a rate of generating the random numbers according to the thermal noise provided by the chaos method does not meet the requirement of a high-speed system. In addition, the oscillator sampling method may be implemented in a flexible way, which may be implemented not only by a full-customized digital analog hybrid circuit but also in a semi-customized digital manner. Therefore, the oscillator sampling method is widely used.

With the development of the high-speed system, the requirement for the true random number generation rate is increased, and the rate of generating the true random numbers by using the oscillator sampling method does not meet the requirement of the high-speed system.

SUMMARY

In view of this, a true random number generator is provided according to an embodiment of the present disclosure, to increase a true random number generation rate and solve a problem in the conventional technology that the true random number generation rate does not meet a system requirement.

The true random number generator according to the embodiment of the present disclosure includes: an Exclusive-Or (XOR) circuit and multiple random entropy source circuits. Each of the multiple random entropy source circuits includes: a low-frequency sampling oscillation loop, an XOR unit, N inverters, and at least two flip-flops, where N is an odd number greater than 1. The N inverters are connected end to end to form a high-frequency oscillation loop. In each of the multiple random entropy source circuits, an input terminal of each of the at least two flip-flops is connected to an output terminal of one of the N inverters corresponding to the flip-flop, an output terminal of the flip-flop is connected to the XOR unit, different flip-flops among the at least two flip-flops correspond to different inverters among the N inverters, and each of the at least two flip-flops performs sampling at the input terminal of the flip-flop under control of a sampling clock signal outputted by the low-frequency sampling oscillation loop. Sampling results of the at least two flip-flops are inputted to the XOR unit, and XOR processing is performed on the sampling results. An output terminal of the XOR unit is an output terminal of one of the multiple random entropy source circuits corresponding to the XOR unit. Output terminals of the multiple random entropy source circuits are respectively connected to different input terminals of the XOR circuit, and a random number sequence is outputted from an output terminal of the XOR circuit.

In an embodiment, sampling clock signals used in each of the multiple random entropy source circuits are provided by a same clock, and sampling clock signals used in the multiple random entropy source circuits are provided by the same clock.

In an embodiment, the number of the flip-flops in each of the multiple of random entropy source circuits is N. In each of the multiple of random entropy source circuits, the flip-flops correspond to the inverters one to one; and an input terminal of each of the flip-flops is connected to an output terminal of the inverter corresponding to the flip-flop, a clock input terminal of each of the flip-flops receives the sampling clock signal outputted by the low-frequency sampling oscillation loop, and output terminals of the flip-flops are respectively connected to different input terminals of the XOR unit.

In an embodiment, low-frequency sampling oscillation loops in the multiple random entropy source circuits are provided as a same circuit.

In an embodiment, low-frequency sampling oscillation loops in the multiple random entropy source circuits are provided as different circuits.

Compared with the conventional technology, the present disclosure at least has the following advantages.

In the embodiments of the present disclosure, the multiple random entropy source circuits are adopted. One entropy source sampling process is performed at the output terminal of each of at least two of the inverters in each of the multiple random entropy source circuits, which is performed by the flip-flop corresponding to the inverter. Sampling results are inputted to the XOR unit and the XOR processing is performed on the sampling results. XOR processing results outputted by the multiple random entropy source circuits are inputted to the XOR circuit, and the XOR processing is performed on the XOR processing results to obtain a random number sequence. With the random number generator provided in the present disclosure, each oscillator has a multi-tap structure rather than a single-tap structure, and a higher sampling clock frequency can be supported under a condition of the same random number quality compared with the conventional true random number generator utilizing phase jitter, and thus the random number generation rate can be increased.

BRIEF DESCRIPTION OF THE DRAWINGS

In order to more clearly illustrate technical solutions in embodiments of the present disclosure or in the conventional technology, the drawings to be used in the description of the embodiments or the conventional technology are briefly described below. Apparently, the drawings in the following description show only some embodiments of the present disclosure, and other drawings may be obtained by those skilled in the art from the drawings without any creative work.

DETAILED DESCRIPTION OF EMBODIMENTS

In order to make those skilled in the art better understand technical solutions of the present disclosure, the technical solutions in the embodiments of the present disclosure are described clearly and completely in conjunction with the drawings in the embodiments of the present disclosure hereinafter. It is apparent that the described embodiments are only some embodiments of the present disclosure, rather than all embodiments. Any other embodiments obtained by those skilled in the art based on the embodiments of the present disclosure without any creative work fall within the protection scope of the present disclosure.

An operation principle of a true random number generator implemented by an oscillator sampling method is described for ease of understanding.

Figure 1:
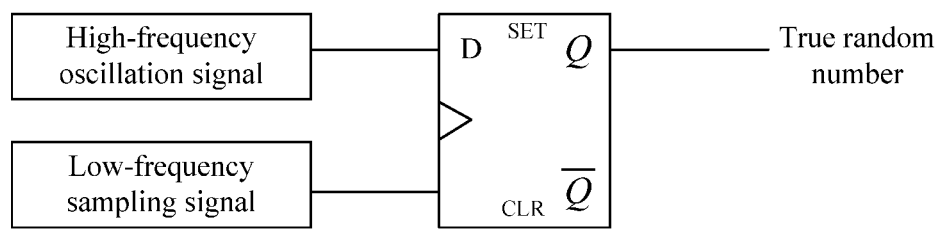
FIG. 1 is a schematic structural diagram of a random number generator in the conventional technology.

Reference is made to FIG. 1, which is a schematic structural diagram of a random number generator in the conventional technology.

A D terminal of a D flip-flop receives a high-frequency oscillation signal generated by a high-frequency oscillator, and a clock signal terminal of the D flip-flop receives a low-frequency clock signal, and an output terminal of the D flip-flop outputs a random sequence. The high-frequency oscillation signal is sampled by using the low-frequency clock signal with jitter, or the high-frequency oscillation signal with jitter is sampled by using the low-frequency clock signal, to obtain a true random number.

Taking the case of sampling the high frequency oscillation signal with jitter by using the low-frequency clock signal to obtain the true random number as an example, in order to output a true random number, data acquired in each sampling period of the low-frequency clock signal is required to be random, and the period of the low-frequency clock signal is required to be greater than a variation amount of the high-frequency oscillation signal. That is, the period of the low-frequency clock signal is required to be greater than a phase deviation of the high-frequency oscillation signal. In the conventional technology, the phase deviation of the high-frequency oscillation signal generated by the high-frequency oscillator is large. In this case, the period of the low-frequency clock signal is large and the sampling frequency is low, which results in a low true random number generation rate, and does not meet requirements of a high-frequency system.

In view of this, a true random number generator is provided according to an embodiment of the present disclosure. By performing multiple sampling processes on a loop oscillator generating a high-frequency oscillation signal, a high-frequency oscillation loop having a single output signal is changed to a high-frequency oscillation loop having multiple output signals, and a phase deviation between the multiple output signals of the high-frequency oscillation loop is smaller than a phase deviation of the overall output of the loop oscillator having the single output signal. In this way, the required period of the low-frequency clock signal can be reduced, and the sampling frequency and the true random number generation rate can be increased, such that the random number generation rate of the true random number generator can meet the requirements of the high-frequency system.

Based on the above, in order to make above objects, features and advantages of the present disclosure more obvious and easy to understand, the embodiments of the present disclosure are described in conjunction with the drawings hereinafter.

Figure 2:
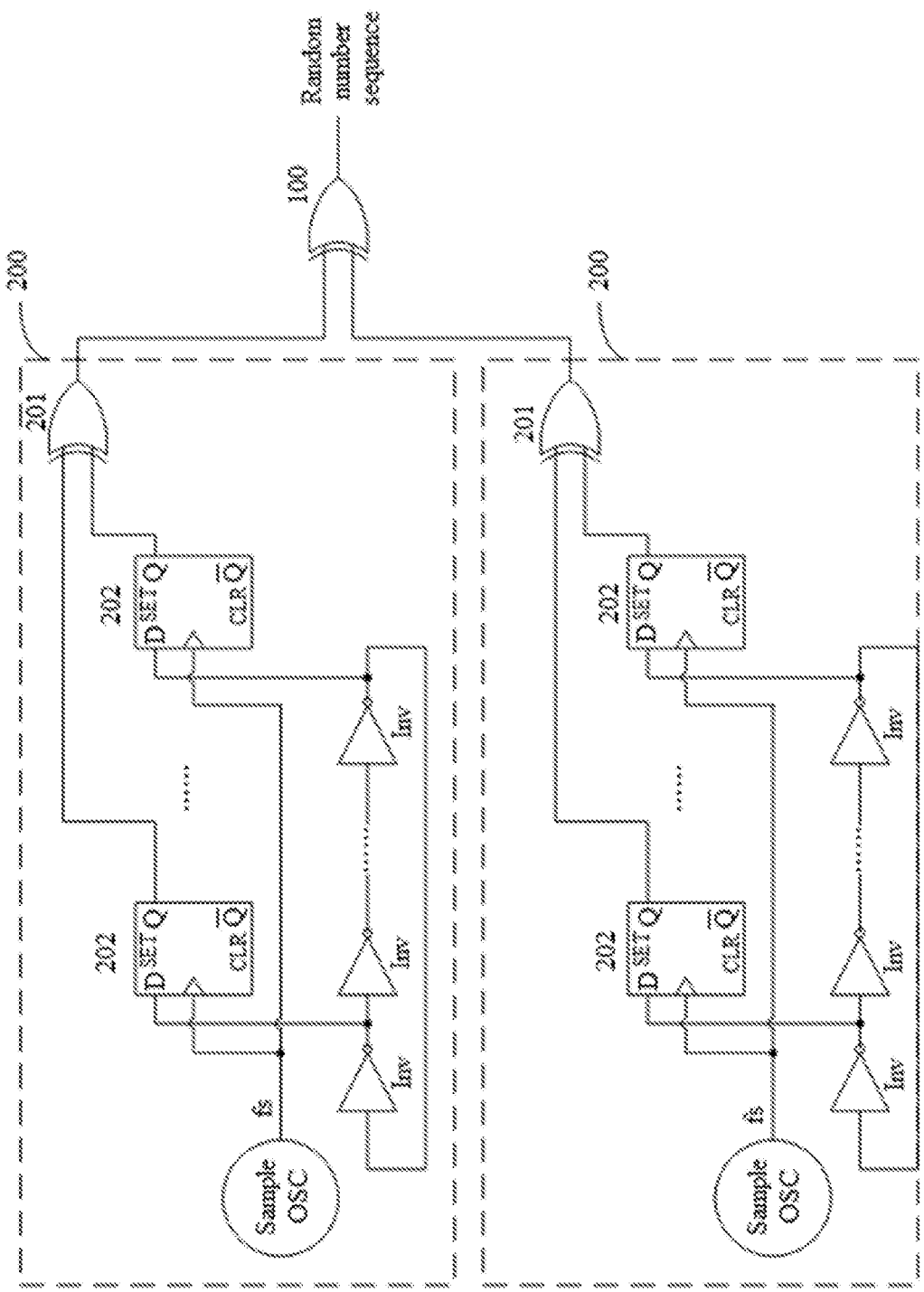
FIG. 2 is a schematic structural diagram of a true random number generator according to an embodiment of the present disclosure.

Reference is made to FIG. 2, which is a schematic structural diagram of a true random number generator according to an embodiment of the present disclosure.

The true random number generator according to the embodiment of the present disclosure includes: an XOR circuit 100, and multiple random entropy source circuits 200. Each of the multiple random entropy source circuits 200 includes: a low-frequency sampling oscillation loop Sample OSC, an XOR unit 201, N inverters Inv, and at least two flip-flops 202, where N is an odd number greater than 1.

The N inverters Inv are connected end to end to form a high-frequency oscillation loop.

Figure 3:
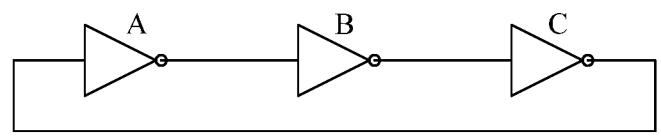
FIG. 3 is a schematic structural diagram of a high-frequency oscillation loop.

In the embodiment of the present disclosure, the high-frequency oscillation loop is formed by connecting an odd number of inverters end to end by means of an inherent transmission delay time of a gate circuit. Thermal noise is generated due to an inversion time delay (i.e., a delay time period) of the inverter in the high-frequency oscillation loop. FIG. 3 schematically illustrates a structure of a high-frequency oscillation loop including three inverters. In actual applications, N may be any odd number greater than 1, for example, 5, 7, 9, 11, and 13, which is not limited in the present disclosure.

Taking the structure including three inverters shown in FIG. 3 as an example, an output terminal of an inverter A is connected to an input terminal of an inverter B, an output terminal of the inverter B is connected to an input terminal of an inverter C, and an output terminal of the inverter C is connected to an input terminal of the inverter A. An output signal may be outputted from any one of connection points.

It is assumed that at a time instant T0, the input terminal of the inverter A is in a high level. After an inverter delay time period $\Delta T$ elapses, i.e., at a time instant $T=T0+\Delta T$, the output terminal of the inverter A (that is, the input terminal of the inverter B) is in a low level. At a time instant $T=T0+2\Delta T$, the output terminal of the inverter B (that is, the input terminal of the inverter C) is in a high level. At a time instant $T=T0+3\Delta T$, the output terminal of the inverter C (that is, the input terminal of the inverter A) is in a low level, which is contrary to the case at the time instant T0. In this case, the input terminal of the inverter A is in the high level again at a time instant $T=T0+6\Delta T$, and one period of oscillation is completed. That is, an oscillation period of the high-frequency oscillation loop is twice a product of the delay time period of each of the inverters and the number of the inverters.

In each of the multiple random entropy source circuits 200, an input terminal of each flip-flop 202 is connected to an output terminal of the inverter Inv corresponding to the flip-flop 202, and an output terminal of the flip-flop 202 is connected to the XOR unit 201. Different flip-flops 202 correspond to different inverters Inv. Further, in each of the multiple random entropy source circuits 200, each flip-flop 202 performs sampling at the input terminal of the flip-flop 202 under control of a sampling clock signal fs outputted by the low-frequency sampling oscillation loop Sample OSC, and sampling results of the flip-flops 202 are inputted to the XOR unit 201, and XOR processing is performed on the sampling results.

An output terminal of the XOR unit 201 is an output terminal of one of the multiple random entropy source circuits 200 corresponding to the XOR unit 201. Output terminals of the multiple random entropy source circuits 200 are respectively connected to different input terminals of the XOR circuit 100. A random number sequence is outputted from an output terminal of the XOR circuit 100.

In the embodiment of the present disclosure, the sampling clock signal fs is a low-frequency clock signal used for the sampling at the input terminals of the flip-flops 202. In order to generate a true random number, sampled data in each sampling period of the sampling clock signal fs is required to be random, and a period of the sampling clock signal fs is required to be greater than a variation of a random source (i.e., the input terminal of the flip-flop 202). Since the multiple flip-flops 202 sample the multiple different inverters Inv, the random source varies faster compared with the conventional technology. In the high-frequency oscillation loop shown in FIG. 3, the phase deviation between a level state of the output terminal of the inverter A and a level state of the output terminal of the inverter B is equal to the delay time period of one inverter (i.e., the inverter B), and is far less than a phase deviation between a level state of the input terminal of the inverter A and a level state of the output terminal of the inverter C, which is a sum of delay time periods of the three inverters. In this case, the sampling clock signal fs having a small period may be used for the sampling at the input terminals of the flip-flops 202, and a random number sequence is obtained after the XOR unit 201 and the XOR circuit 100 perform the XOR processing on the sampling results, improving the sampling rate and the true random number generation rate.

It may be understood that a main method for measuring quality of the true random number generator is to measure the entropy of the generated random numbers. In the information theory, the entropy is a measure standard for uncertainty, which may be in unit of bits. As the entropy is close to 1, the quality of the random numbers becomes better. Therefore, in some implementations of the embodiment of the present disclosure, the number of the flip-flops 202 included in each of the random entropy source circuits 200 may be N. In each of the random entropy source circuits 200, the flip-flops correspond to the inverters Inv one to one.

Further, in each of the random entropy source circuits 200, the input terminal of each of the flip-flops 202 is connected to the output terminal of the inverter Inv corresponding to the flip-flop 202, the clock input terminal of each of the flip-flops 202 receives the sampling clock signal fs outputted by the low-frequency sampling oscillation loop Sample OSC, and output terminals of the flip-flops 202 are respectively connected to different input terminals of the XOR unit 201. One entropy source sampling process is performed at the output terminal of each of the inverters in the random entropy source circuit 200.

Figure 4:
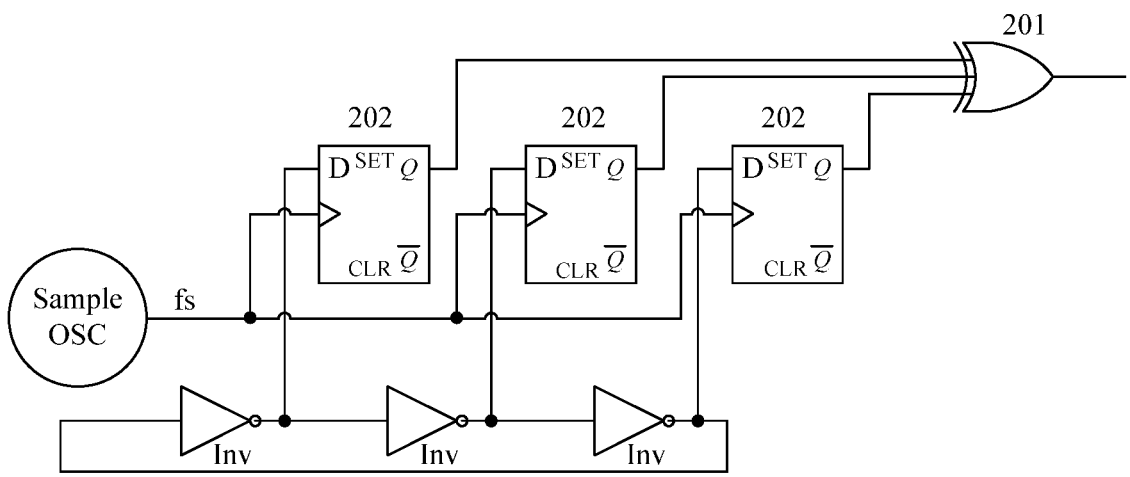
FIG. 4 is a schematic structural diagram of a random entropy source circuit in the true random number generator according to the embodiment of the present disclosure.

Taking the case in which N is equal to 3 as an example, FIG. 4 shows a circuit topology of a random entropy source circuit according to an embodiment of the present disclosure.

In an embodiment, each of the flip-flops 202 may be a D flip-flop. Sampling clock signals fs used in each of the multiple random entropy source circuit 200 are provided by a same clock, and sampling clock signals fs used in the multiple random entropy source circuits are provided by the same clock.

In an embodiment, low-frequency sampling oscillation loops Sample OSC in the multiple random entropy source circuits 200 are provided as a same circuit. In another embodiment, low-frequency sampling oscillation loops Sample OSC in the multiple random entropy source circuits 200 are provided as different circuits.

In the embodiments of the present disclosure, the multiple random entropy source circuits are adopted. One entropy source sampling process is performed at the output terminal of each of at least two of the inverters in each of the multiple random entropy source circuits, which is performed by the flip-flop corresponding to the inverter. Sampling results are inputted to the XOR unit and the XOR processing is performed on the sampling results. XOR processing results outputted by the multiple of random entropy source circuits are inputted to the XOR circuit, and the XOR processing is performed on the XOR processing results to obtain a random number sequence. With the random number generator provided in the present disclosure, each oscillator has a multi-tap structure rather than a single-tap structure, and a higher sampling clock frequency can be supported under a condition of the same random number quality compared with the conventional true random number generator utilizing phase jitter, and thus the random number generation rate can be increased.

It should be understood that in the present disclosure, the term "at least one" indicates one or more, and the term "many" indicates two or more. The term "and/or" is used for describing an association relationship between associated objects, and indicates that there may be three relationships. For example, "A and/or B" indicates three cases, including a case that there is only A, a case that there is only B, and a case that there are both A and B, where A and B may be in single or plural forms. The character "/" generally indicates that associated objects are in an "or" relationship. The statement "at least one of the following" or other similar statements indicates any combination of these terms, including any combination of a single term or plural terms. For example, the statement "at least one of a, b, and c" may indicate the following cases: "a", "b", "c", "a and b", "a and c", "b and c", or "a, b and c," where each of a, b, and c may be in single or plural forms. For ease of the description, the case of two sampling branches and each sampling module including two D flip-flops is illustrated in the drawings as an example, which is not intended to limit the scope protection of the present disclosure. In actual applications, the number of flip-flops included in the true random number generator may be set according to requirements for the random number quality, the random number generation rate, the chip area and the implementation manner, which are not listed herein.

It should be noted that, the embodiments of the present disclosure are described in a progressive manner, each of the embodiments emphasizes differences from other embodiments, and the same or similar parts among the embodiments can be referred to each other.

It should further be noted that relationship terminologies herein such as "first", "second" are only used to distinguish one entity or operation from another entity or operation, rather than necessitating or implying an actual relationship or order between the entities or operations. Furthermore, terms such as "include", "comprise" or any other variations thereof are intended to be non-exclusive. Therefore, a process, a method, an article or a device including a series of elements includes not only the elements but also other elements that are not enumerated, or further includes the elements inherent for the process, the method, the article or the device. Unless expressively limited otherwise, an element defined by the statement "comprising (including) a . . ." does not exclude the case that the process, the method, the article or the device including the element may include other similar elements.

What is described above is only preferred embodiments of the present disclosure and is not intended to limit the present disclosure in any way. The preferred embodiments of the present disclosure are disclosed above, which should not be interpreted as limiting the present disclosure. Numerous alternations, modifications, and equivalents can be made to the technical solutions of the present disclosure by those skilled in the art in light of the methods and technical content disclosed herein without deviation from the scope of the present disclosure. Therefore, any alternations, modifications, and equivalents made to the embodiments above according to the technical essential of the present disclosure without deviation from the scope of the present disclosure should fall within the scope of protection of the present disclosure.

The invention claimed is:

1. A true random number generator, comprising:
an Exclusive-Or (XOR) circuit; and
a plurality of random entropy source circuits, wherein
each of the plurality of random entropy source circuits comprises: a low-frequency sampling oscillation loop, an XOR unit, a plurality of inverters and a plurality of flip-flops, wherein the number of inverters and the number of flip-flops in each of the plurality of random entropy source circuits are both N, and N is an odd number greater than 1;
the N inverters are connected end to end to form a high-frequency oscillation loop;
in each of the plurality of random entropy source circuits, an input terminal of each of the N flip-flops is connected to an output terminal of one of the N inverters corresponding to the flip-flop, an output terminal of the flip-flop is connected to the XOR unit, each of the N flip-flops corresponds to a different inverter in the N inverters, each of the N flip-flops performs sampling at the input terminal of the flip-flop under control of a sampling clock signal outputted by the low-frequency sampling oscillation loop, and sampling results of the N flip-flops are inputted to the XOR unit, and XOR processing is performed on the sampling results; and
an output terminal of the XOR unit is an output terminal of one of the plurality of random entropy source circuits corresponding to the XOR unit, output terminals of the plurality of random entropy source circuits are respectively connected to different input terminals of the XOR circuit, and a random number sequence is outputted from an output terminal of the XOR circuit.

2. The true random number generator according to claim 1, wherein sampling clock signals used in each of the plurality of random entropy source circuits are provided by a same clock, and sampling clock signals used in the plurality of random entropy source circuits are provided by the same clock.

3. The true random number generator according to claim 1, wherein
in each of the plurality of random entropy source circuits, the flip-flops correspond to the inverters one to one; and
an input terminal of each of the flip-flops is connected to an output terminal of the inverter corresponding to the flip-flop, a clock input terminal of each of the flip-flops receives the sampling clock signal outputted by the low-frequency sampling oscillation loop, and output terminals of the flip-flops are respectively connected to different input terminals of the XOR unit.

4. The true random number generator according to claim 1, wherein low-frequency sampling oscillation loops in the plurality of random entropy source circuits are provided as a same circuit.

5. The true random number generator according to claim 1, wherein low-frequency sampling oscillation loops in the plurality of random entropy source circuits are provided as different circuits.

* * * * *